(12) United States Patent
Aitken et al.

(10) Patent No.: US 7,315,075 B2
(45) Date of Patent: Jan. 1, 2008

(54) CAPACITOR BELOW THE BURIED OXIDE OF SOI CMOS TECHNOLOGIES FOR PROTECTION AGAINST SOFT ERRORS

(75) Inventors: John M Aitken, South Burlington, VT (US); Ethan H. Cannon, Essex Junction, VT (US); Philip J. Oldiges, Lagrangeville, VT (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 10/905,906

(22) Filed: Jan. 26, 2005

(65) Prior Publication Data

US 2006/0163635 A1 Jul. 27, 2006

(51) Int. Cl.
*H01L 29/00* (2006.01)
*H01L 29/76* (2006.01)
*H01L 29/94* (2006.01)
*H01L 31/062* (2006.01)

(52) U.S. Cl. .................. 257/532; 257/528; 257/296; 257/297; 257/300

(58) Field of Classification Search ............... 257/296, 257/297, 300, 532, 528
See application file for complete search history.

(56) References Cited

U.S. PATENT DOCUMENTS

| | | |
|---|---|---|
| 5,378,919 A | 1/1995 | Ochiai |
| 6,225,664 B1 | 5/2001 | Endo et al. |
| 6,337,253 B1 | 1/2002 | Davari et al. |
| 6,794,901 B2 | 9/2004 | Bernstein et al. |
| 2001/0040467 A1 | 11/2001 | Kumar et al. |
| 2002/0185684 A1 | 12/2002 | Campbell et al. |
| 2003/0094654 A1 | 5/2003 | Christensen et al. |
| 2003/0199128 A1 | 10/2003 | Furukawa |
| 2003/0234430 A1 | 12/2003 | Friend et al. |
| 2004/0041208 A1 | 3/2004 | Bhattacharyya |
| 2004/0216015 A1 | 10/2004 | Bernstein et al. |

*Primary Examiner*—Sara Crane
*Assistant Examiner*—Samuel A. Gebremariam
(74) *Attorney, Agent, or Firm*—Gibb & Rahman, LLC; Anthony Canale

(57) ABSTRACT

Disclosed is a semiconductor structure that incorporates a capacitor for reducing the soft error rate of a device within the structure. The multi-layer semiconductor structure includes an insulator-filled deep trench isolation structure that is formed through an active silicon layer, a first insulator layer, and a first bulk layer and extends to a second insulator layer. The resulting isolated portion of the first bulk layer defines the first capacitor plate. A portion of the second insulator layer that is adjacent the first capacitor plate functions as the capacitor dielectric. Either the silicon substrate or a portion of a second bulk layer that is isolated by a third insulator layer and another deep trench isolation structure can function as the second capacitor plate. A first capacitor contact couples, either directly or via a wire array, the first capacitor plate to a circuit node of the device in order to increase the critical charge, Qcrit, of the circuit node.

12 Claims, 11 Drawing Sheets

CAPACITOR BELOW THE BURIED OXIDE OF SOI CMOS TECHNOLOGIES FOR PROTECTION AGAINST SOFT ERRORS

FIELD OF THE INVENTION

The invention relates generally to complimentary metal oxide semiconductor (CMOS) structures. Particularly, the invention relates to a semiconductor structure that incorporates a capacitor within the structure for reducing the soft error rate of a circuit.

DESCRIPTION OF THE RELATED ART

Solid-state circuits, including memory devices and flip-flops, are susceptible to upset by ionizing radiation, noise and other sources. These upsets are known as soft errors because information is lost but the circuit is not damaged. Soft errors due to ionizing radiation events are known as single-event upsets because a single radiation particle can cause the upset. As a result of CMOS technology scaling, both the supply voltage and the capacitance of the circuit nodes of circuits are decreasing. Thus, less charge is stored at the circuit node and less charge is required to cause a soft error. The minimum charge required to cause a soft error is known as the critical charge, Qcrit. As Qcrit decreases, soft error susceptibility (i.e., the soft error rate (SER)) increases and vice versa.

SUMMARY OF THE INVENTION

This disclosure presents a semiconductor structure that incorporates a capacitor for reducing the soft error rate of a device within the structure by increasing the minimum charge required to cause a soft error at the circuit node of the device. In each embodiment, the multi-layer semiconductor structure comprises an insulator-filled deep trench isolation structure formed through an active silicon layer, a first insulator layer, and a first bulk layer to a second insulator layer. The resulting isolated portion of the first bulk layer defines the first capacitor plate. A portion of the second insulator layer that is adjacent the first capacitor plate functions as the capacitor dielectric. A capacitor contact couples the first capacitor plate to a circuit node of the device to increase the minimum charge required to cause a soft error (i.e., Qcrit) in the circuit node.

One embodiment of the semiconductor structure comprises an active layer with a first device in the active layer. The active layer is on a first insulator layer. The first insulator layer is on a first bulk layer. The first bulk layer is on a second insulator layer and the second insulator layer is on a second bulk layer. A first insulator-filled deep trench isolation structure is positioned adjacent the first device and extends to the second insulator layer. A capacitor is coupled to the device. The capacitor comprises a first capacitor plate, a capacitor dielectric, a second capacitor plate, and first and second capacitor contacts. The first capacitor plate of this structure is positioned adjacent a second side of the first insulator layer in a region opposite from the location of the device positioned on the first side of the first insulator layer. An area measurement of the first capacitor plate is at least equal in size relative to an area measurement of the first device. The first device can comprise a sensitive circuit node (i.e., a first circuit node susceptible to soft errors). The first capacitor contact may abut the first circuit node so that it effectively couples the first circuit node to the first capacitor plate. The capacitor can be configured to increase the minimum charge required to cause a soft error in this first circuit node. The semiconductor structure can further comprise a second device in the active layer. Additionally, the semiconductor structure can comprise a plurality of devices in the active layer, including the first device and at least one third device. The first deep trench isolation structure may be positioned around the plurality of devices to isolate the plurality of devices from one or more second devices in the active layer. Each of the plurality of devices is isolated from another by shallow trench isolation structures. A portion of the first bulk layer that is defined by the first deep trench isolation structure comprises the first capacitor plate. The capacitor dielectric comprises a portion of the second insulator layer that is adjacent the first capacitor plate. The first capacitor contact contacts the first capacitor plate.

The entire second bulk layer or a portion thereof can comprise the second capacitor plate. The second capacitor plate is insulated from the first capacitor plate by the first deep trench isolation structure and the capacitor dielectric. A second capacitor contact contacts the second capacitor plate. If the entire second bulk layer comprises the second capacitor plate, than the second bulk layer may be grounded. If only a portion of the second bulk layer comprises the second capacitor plate, then a second insulator-filled deep trench isolation structure, extending down to the second insulator layer, may be formed around the second capacitor contact and, optionally, around one or more second devices in the active layer. The second capacitor contact may further contact a wire array above the active layer or the circuit node (i.e., second circuit node) of a second device in the active layer and enclosed within the second deep trench isolation structure. Again, if only a portion of the second bulk layer comprises the second capacitor plate, then the semiconductor structure may further comprise a third insulator layer adjacent the second bulk layer and a third insulator-filled deep trench isolation structure. The third deep trench isolation structure is formed around the first deep trench isolation structure and the second deep trench isolation structure, extends to the third insulator layer and defines the portion of the second bulk layer comprising the second capacitor plate. Additionally, the semiconductor structure may further comprise a substrate adjacent the third insulator layer and a substrate contact contacting the substrate. The third deep trench isolation structure and the third insulator layer insulate the capacitor from the substrate.

Another embodiment of the semiconductor structure comprises an active layer with a first device in the active layer. The active layer is on a first insulator layer. The first insulator layer is on a first bulk layer. The first bulk layer is on a second insulator layer and the second insulator layer is on a second bulk layer. A capacitor is coupled to the first device. The capacitor comprises a first capacitor plate, a capacitor dielectric, a second capacitor plate, and first and second capacitor contacts. The first capacitor plate of this structure is positioned adjacent to a second side of the first insulator layer in a region offset from the location of the device on the first side of the first insulator layer. An area measurement of the first capacitor plate is smaller in size relative to an area measurement of the device. A first insulator-filled deep trench isolation structure is positioned around the first capacitor contact and extends to the second insulator layer. This first deep trench isolation structure isolates the first capacitor contact and defines a portion of the first bulk layer comprising the first capacitor plate. The capacitor dielectric comprises a portion of the second insulator layer adjacent the first capacitor plate. The isolated first capacitor contact contacts the first capacitor plate and a first wire array above the active layer. The first device can comprise a sensitive circuit node (i.e., first circuit node) and the capacitor can be configured to increase the minimum charge required to cause a soft error in the first circuit node. The first wire array can couple the first capacitor contact and thereby, the first capacitor plate, to the first circuit node.

The entire second bulk layer or a portion thereof can comprise the second capacitor plate. The second capacitor plate is insulated from the first capacitor plate by the first deep trench isolation structure and the capacitor dielectric. A second capacitor contact contacts the second capacitor plate. If the entire second bulk layer comprises the second capacitor plate, than the second bulk layer may be grounded. If only a portion of the second bulk layer comprises the second capacitor plate, then a second insulator-filled deep trench isolation structure, extending down to the second insulator layer, may be formed around the second capacitor contact and, optionally, around a second device, having a second circuit node. The second capacitor contact may further contact a second wire array above the active layer or the second circuit node of a second device in the active layer and enclosed within the second deep trench isolation structure. Also, if only a portion of the second bulk layer comprises the second capacitor plate, then the semiconductor structure may further comprise a third insulator layer adjacent the second bulk layer and a third insulator-filled deep trench isolation structure. The third deep trench isolation structure is formed around the first deep trench isolation structure and the second deep trench isolation structure, extends to the third insulator layer and defines the portion of the second bulk layer comprising the second capacitor plate. Additionally, the semiconductor structure may further comprise a substrate adjacent the third insulator layer and a substrate contact contacting the substrate. The third deep trench isolation structure and the third insulator layer insulate the capacitor from the substrate.

BRIEF DESCRIPTION OF THE DRAWINGS

The invention will be better understood from the following detailed description with reference to the drawings, in which.

DETAILED DESCRIPTION OF EMBODIMENTS OF THE INVENTION

Figure 1:
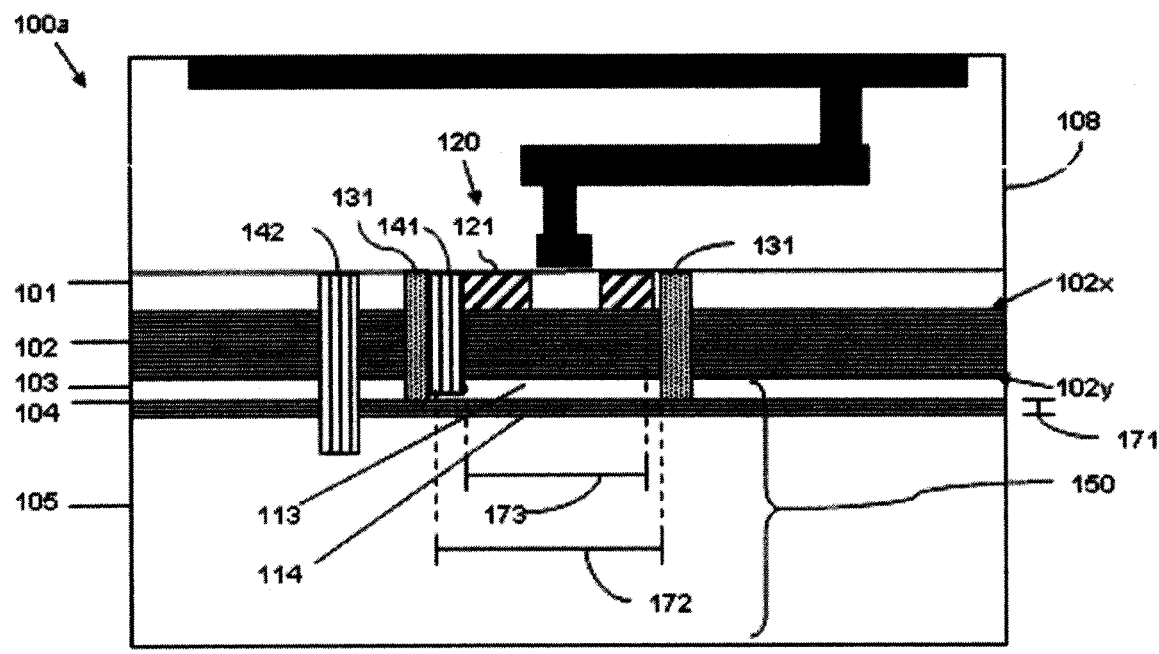
FIG. 1 is a schematic illustration of an embodiment of a semiconductor structure according to the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

One method of decreasing soft error sensitivity (i.e., the SER) through increasing the minimum charge to cause a soft error (i.e., Qcrit) is by adding capacitance to the sensitive circuit node of the device. Increasing the capacitance of the sensitive circuit node can be accomplished by including thin or thick oxide capacitance. However, this method of increasing capacitance also increases the size of the device. Increasing the capacitance can also be accomplished by applying a metal-insulator-metal (MIM) capacitor in the metallization process (i.e., during the process in which layer(s) of metal are deposited on the semiconductor surface over the active layer to provide electrical contact to the devices). However, this method can potentially increase the complexity and size of the semiconductor structure and can slow down performance. In using either technique, size, complexity, and performance penalties must be weighed against the value of reducing the SER.

The present invention relates to a semiconductor structure that incorporates a capacitor for reducing the soft error rate of a sensitive circuit node (i.e., a circuit node that is particularly susceptible to soft errors) of a device within the structure by increasing the minimum charge required to cause the soft error (i.e., Qcrit). Each embodiment of the semiconductor structure of the present invention comprises a multi-layer structure that incorporates a capacitor below a first insulator layer (e.g., buried oxide (BOX) layer) on which one or more devices are positioned.

Referring generally to FIGS. 1-11, each embodiment of the structure 100, 200 of the present invention comprises a capacitor 150, 250 incorporated into a multi-layer semiconductor structure. The capacitor 150, 250 comprises a first capacitor plate, a capacitor dielectric, a second capacitor plate and first and second conductive capacitor contacts. Two structural embodiments are illustrated, 100 of FIGS. 1-8 and 200 of FIGS. 9-11. The two structures 100, 200 differ in the positioning and size of the first capacitor plate 113, 213 in relation to the device 120, 220. Specifically, referring to structure 100 of FIGS. 1-8, the capacitor 150 is positioned adjacent the second side of the first insulator layer 102 in a region opposite the position of the device 120 on the first side of the first insulator layer 102. An area measurement of the first capacitor plate 113 is equal to or greater than an area measurement of the device 120. Referring to structure 200 of FIGS. 9-11, the capacitor 250 is positioned adjacent the second side of the first insulator layer 202, but offset from the position of the device 220 on the first side of the first insulator layer 202. An area measurement of the first capacitor plate 213 is less than an area measurement of the device 220. Additionally, there may be minor variations within each structure 100, 200 (e.g., 100a-g, 200a-c).

Each semiconductor structure 100, 200 further comprises an insulator-filled deep trench isolation structure 131, 231 formed through an active layer (e.g., a silicon layer, including semiconductor devices) 101, 201 through a first insulator layer (e.g., relatively thick buried oxide (BOX) layer) 102, 202 through a first bulk layer (e.g., another silicon layer) 103, 203 to a second insulator layer (e.g., a relatively thin sub-BOX layer) 104, 204. The resulting isolated portion of the first bulk layer 103, 203 defines the first capacitor plate 113, 213 of the capacitor 150, 250. The first bulk layer 103, 203 is doped such that the first capacitor plate 113, 213 is the same type silicon (e.g., p-type or n-type) as the sensitive circuit node 121, 221. A portion of the second insulator layer 104, 204 that is adjacent the first capacitor plate 113, 213 functions as the capacitor dielectric 114, 214. A second bulk layer (e.g., another silicon layer) 105, 205 is formed adjacent the second insulator layer 104, 204. An oxide layer 108, 208, comprising the gate oxides, can be formed on the active layer 101, 201.

Figure 7:
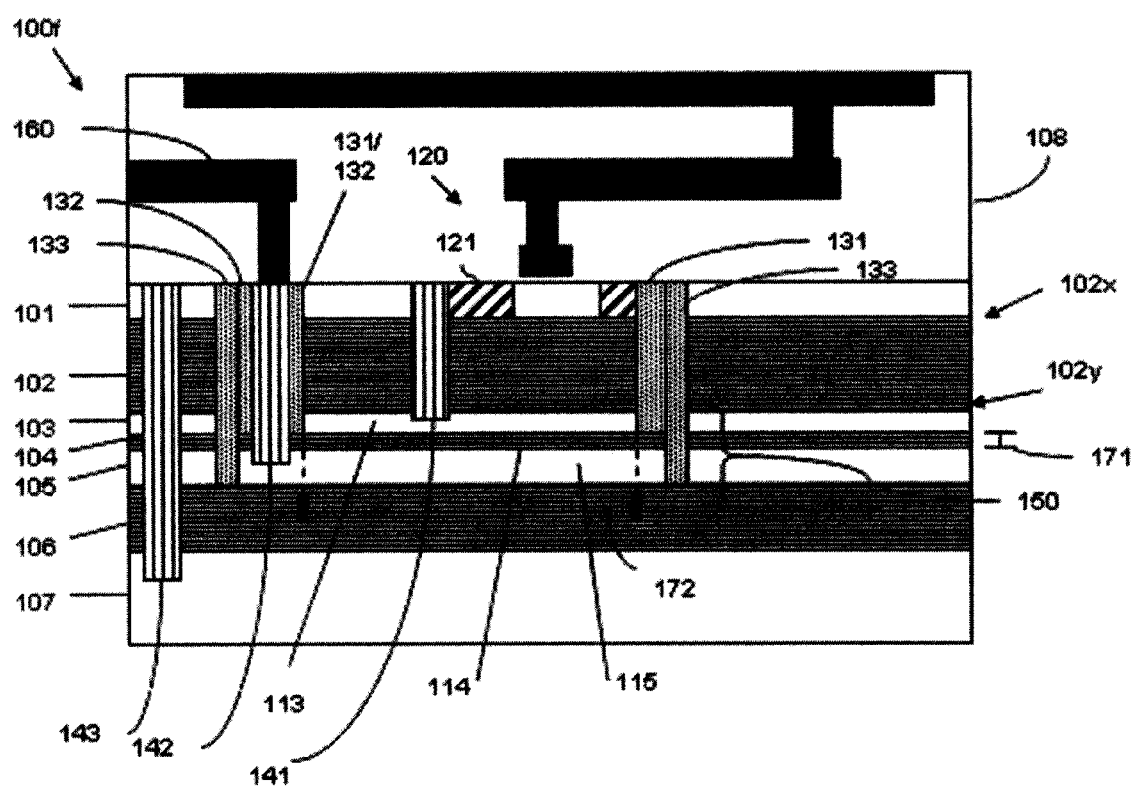
FIG. 7 is a schematic illustration of an embodiment of a semiconductor structure according to the invention.
Figure 8:
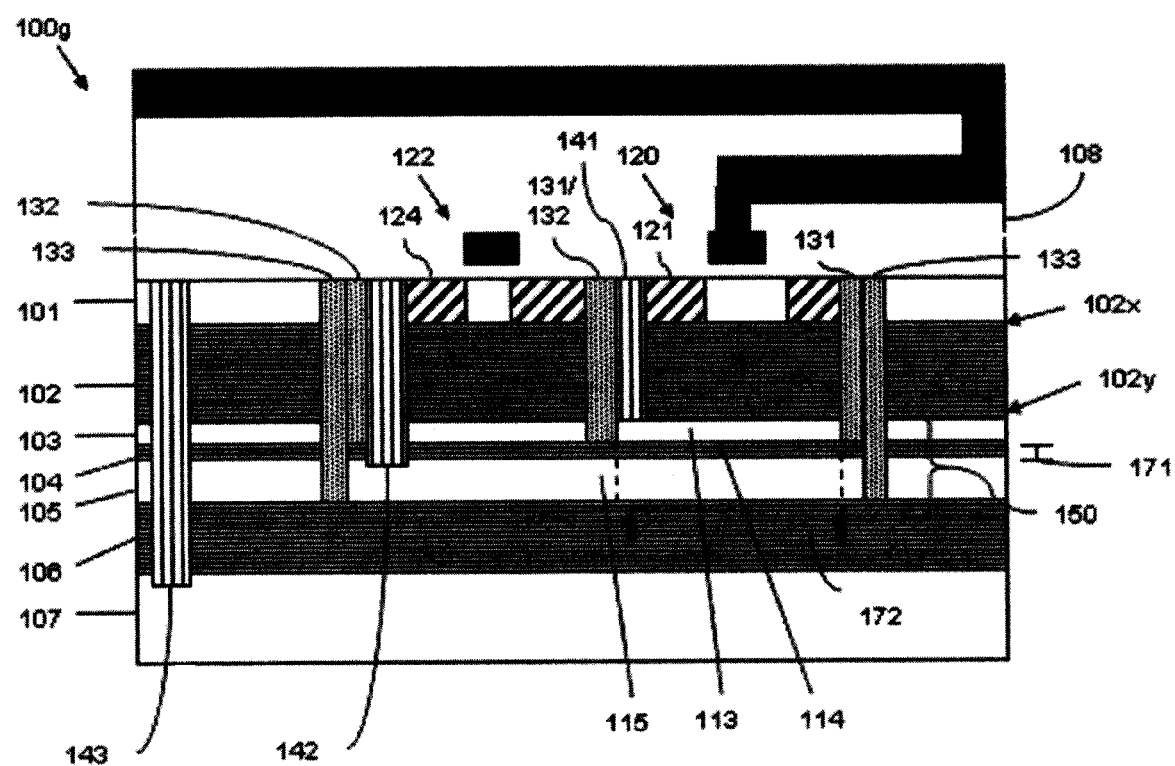
FIG. 8 is a schematic illustration of an embodiment of a semiconductor structure according to the invention.
Figure 9:
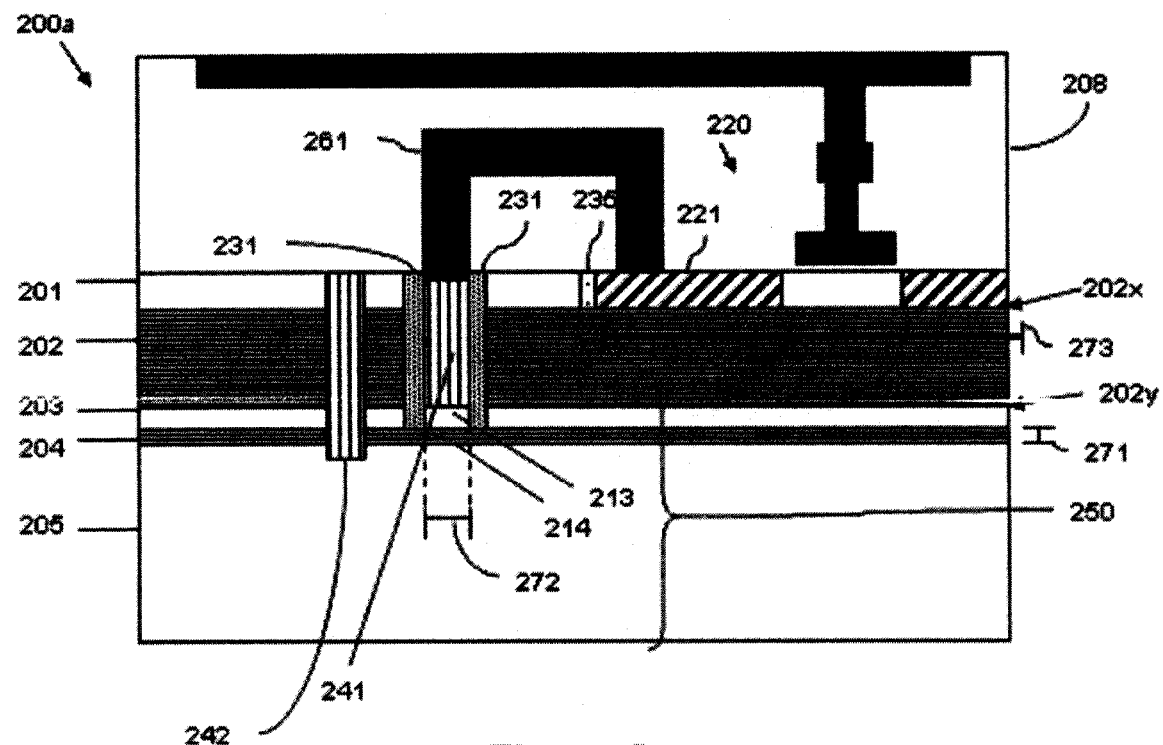
FIG. 9 is a schematic illustration of an embodiment of a semiconductor structure according to the invention.

For each structure 100, 200 the entire second bulk layer 105, 205 may comprise the second capacitor plate, as illustrated in structures 100a-e of FIGS. 1-5, respectively, and structure 200a of FIG. 9. Alternatively, the capacitor 150, 250 may comprise a separate isolated second capacitor plate 115, 215. Referring to FIGS. 7-8 and 10-11, a portion of the second bulk layer 105, 205, isolated by a third insulator layer 106, 206 (e.g., sub-sub-BOX layer) and by a third insulator-filled deep trench isolation structure 133, 233, comprises the second capacitor plate 115, 215. The third deep trench isolation structure 133, 233 is formed around the first deep trench isolation structure 131, 231 and the second deep trench isolation structure 132, 232, extends to the third insulator layer 106, 206, and defines the portion of the second bulk layer 105, 205 that comprises the second capacitor plate 115, 215. Isolating the second capacitor plate 115, 215 provides for several advantages. It allows for contacting a separate silicon substrate 107, 207 (i.e., third bulk layer) without impacting the capacitor 150, 250. It also allows for the second capacitor plate 115, 215 of multiple capacitors 150, 250 on the same wafer to be configured at different potentials. Additionally, isolating the second capacitor plate 115, 215 would allow the capacitor 150, 250 to be positioned between two nodes of a static random access memory (SRAM) which is more effective than placing the capacitor between one of the nodes and ground.

For each structure 100, 200, the capacitance between the first capacitor plate 113, 213 and the second capacitor plate (105 of FIGS. 1-5, 205 of FIG. 9, 115 of FIGS. 7-8, and 215 of FIGS. 10-11, respectively) can increase the minimum charge required to cause a soft error (i.e., Qcrit) of a sensitive circuit node 121, 221 by a value of up to the voltage difference between the first capacitor plate 113, 213 and the second capacitor plate (105 of FIGS. 1-5, 205 of FIG. 9, 115 of FIG. 7-8, and 215 of FIG. 10-11, respectively) times the capacitance (C). Thus, the capacitor 150, 250 of the semiconductor structures 100, 200 may be used to harden circuit nodes 121, 221 on critical devices 120, 220, if the devices 120, 220 are able to tolerate some performance or size penalties in exchange for reducing the soft error rate. The critical devices 120, 220 can comprise memory devices, flip-flops, latches, fuse latches (i.e., latches in which upsetting one latch can cause the memory to swap in an un-initialized column of memory that may contain bad bits), machine states, etc.

More particularly, referring to FIGS. 1-5 and 7-8, a multi-layer semiconductor structure 100 incorporating a capacitor 150 to reduce the soft error rate of a first device 120 (e.g., a bi-stable device having a first circuit node 121) within the structure 100 is illustrated. FIGS. 1-5 and 7-8 illustrate the same basic structure 100 with minor variations, to form structures 100a-g, as discussed below. The multi-layer semiconductor structure 100 comprises the following layers in order: an active layer 101, a first insulator layer 102, a first bulk layer 103, a second insulator layer 104 and a second bulk layer 105. The second insulator layer 104 may be either continuous, as illustrated in FIGS. 1, 3-5 and 7-8, or patterned, as illustrated in structure 100b of FIG. 2. A capacitor 150 is positioned below the first insulator layer 102 and is coupled to the device 120. The capacitor 150 comprises a first capacitor plate 113, a capacitor dielectric 114, a second capacitor plate (105 of FIGS. 1-5 and 115 of FIGS. 7-8), a first conductive capacitor contact 141 and a second conductive capacitor contact 142.

Figure 2:
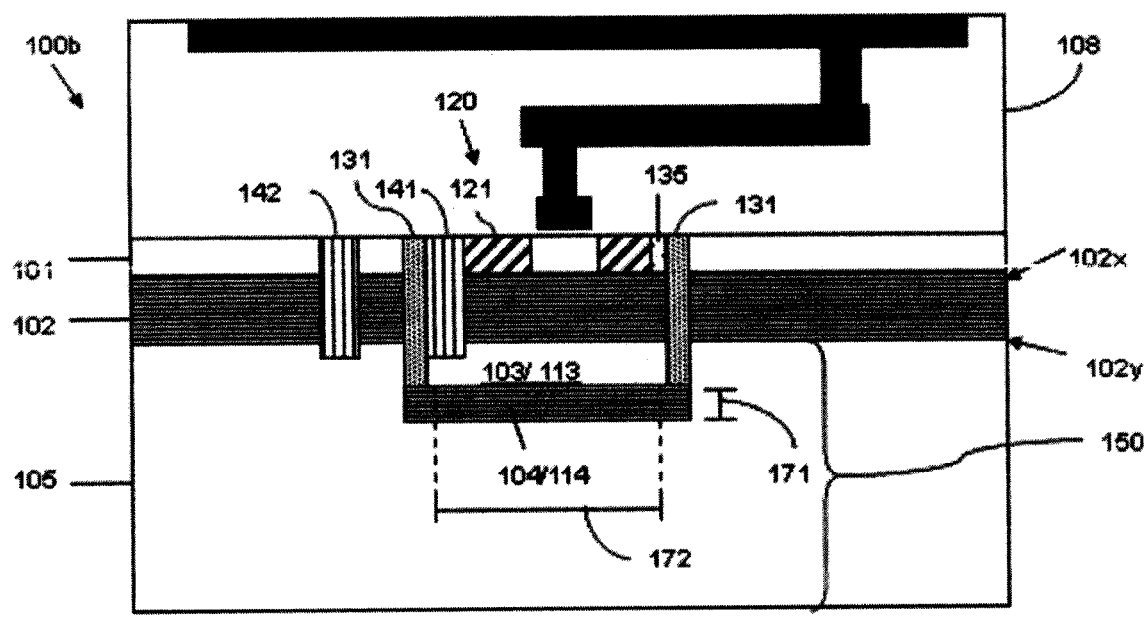
FIG. 2 is a schematic illustration of an embodiment of a semiconductor structure according to the invention.
Figure 3:
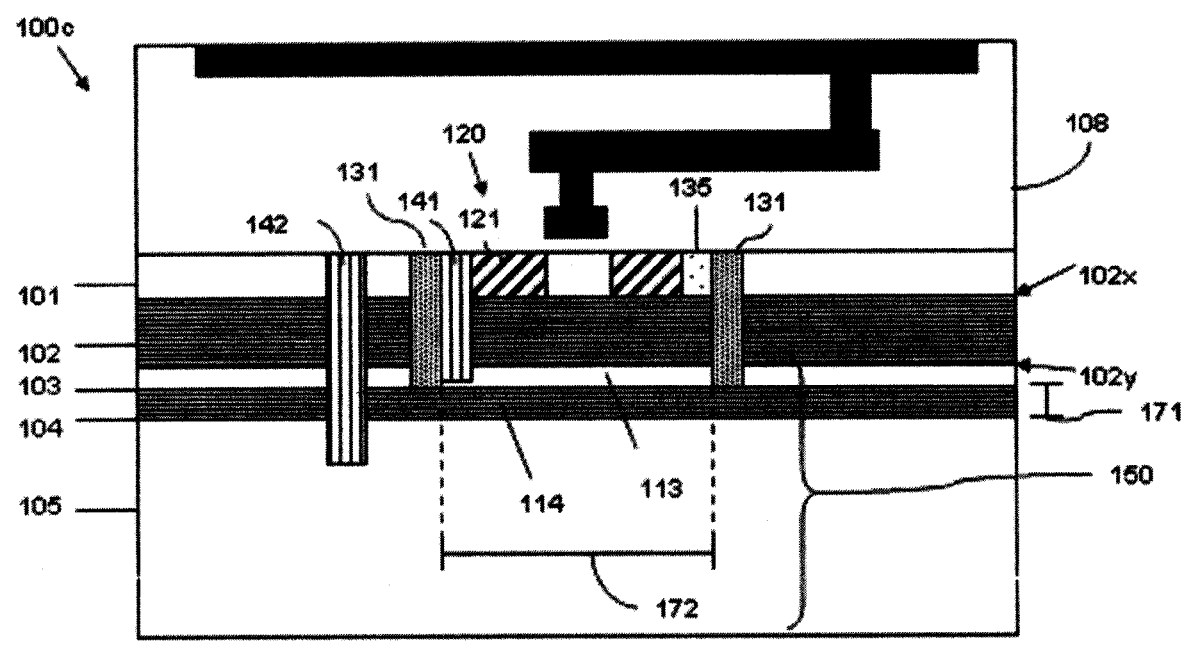
FIG. 3 is a schematic illustration of an embodiment of a semiconductor structure according to the invention.
Figure 4:
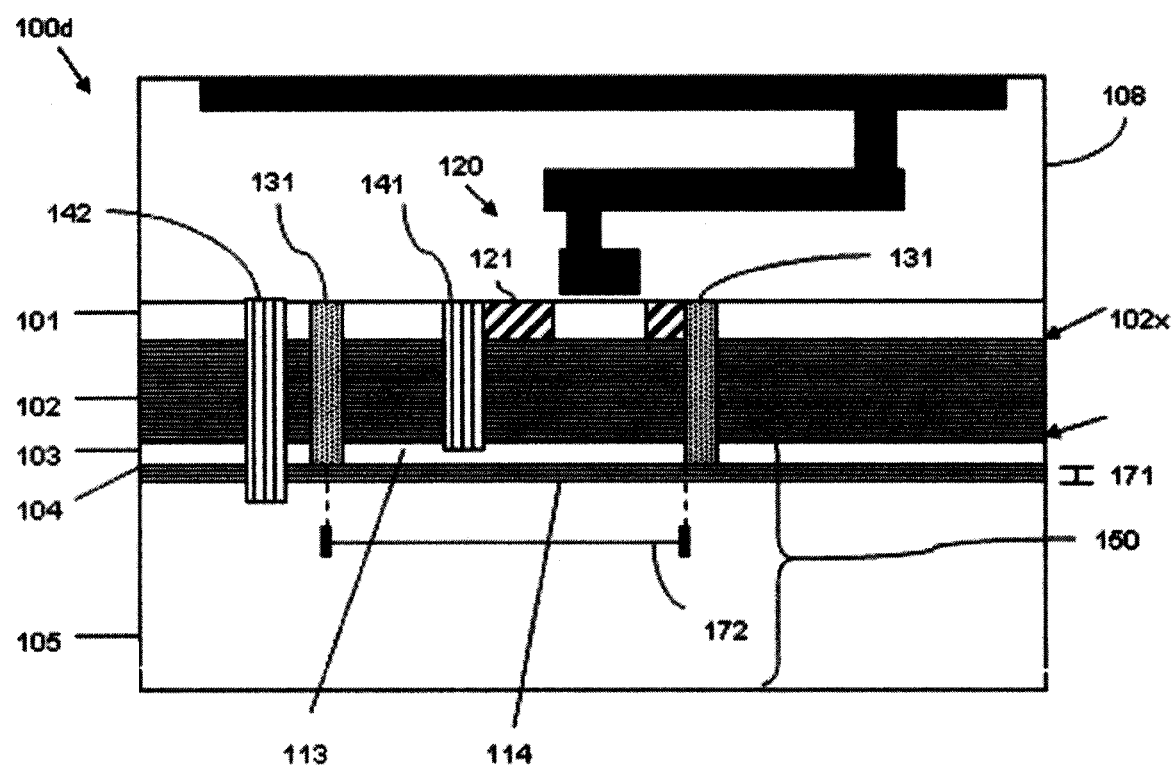
FIG. 4 is a schematic illustration of an embodiment of a semiconductor structure according to the invention.
Figure 5:
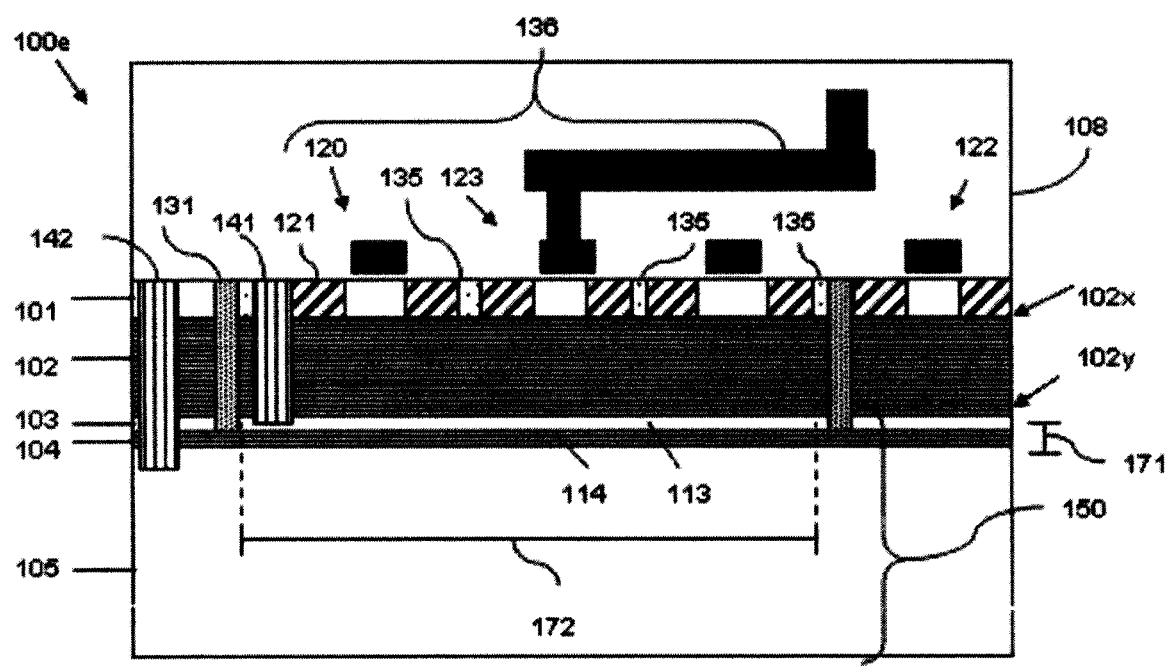
FIG. 5 is a schematic illustration of an embodiment of a semiconductor structure according to the invention.
Figure 6:
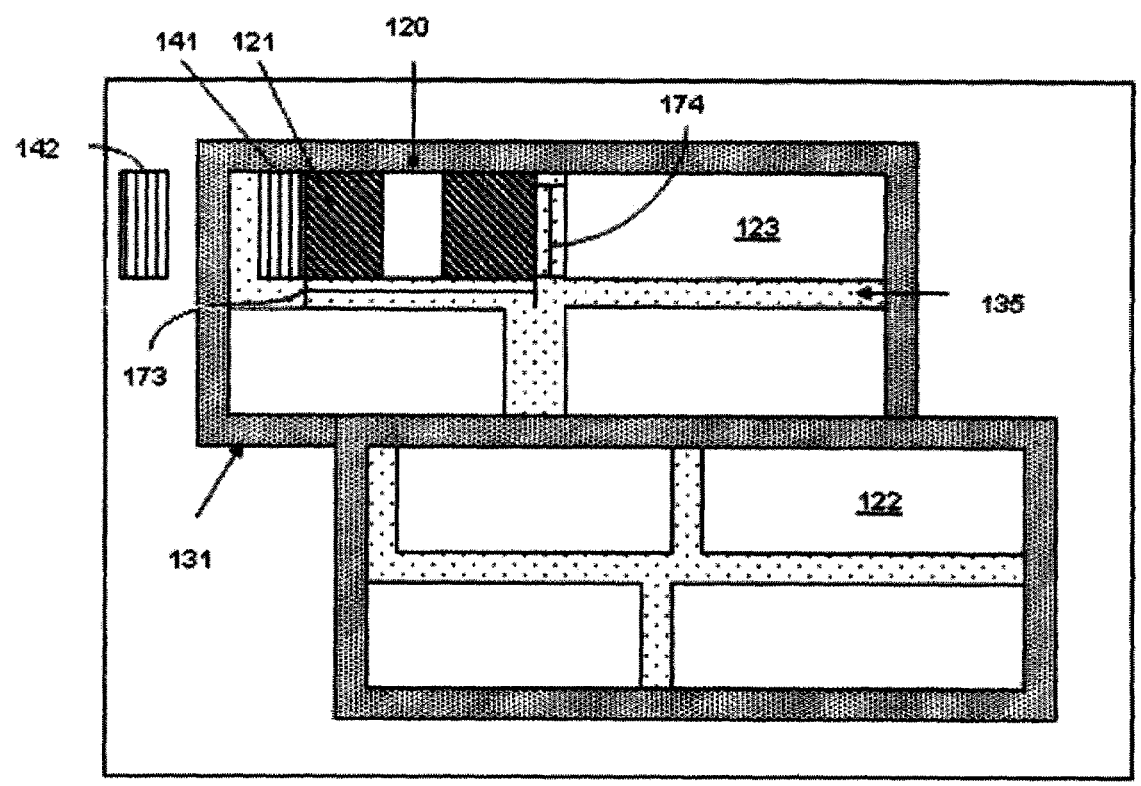
FIG. 6 is a schematic top-view illustration of the embodiment of FIG. 5.

The first insulator layer 102 comprises a first side 102x and a second side 102y. The active layer 101 containing the first device 120 is positioned on the first side of the insulator layer 102x. The first capacitor plate 113 is positioned adjacent the second side of the first insulator layer 102y in a region opposite the first device 120. A first insulator-filled deep trench isolation structure 131 is positioned around the first device 120 and extends to the second insulator layer 104. Thus, the size (i.e., an area measurement) of the first capacitor plate 113 and the position of the first capacitor plate 113 are dependent upon the first deep trench isolation structure 131. An area measurement of the first capacitor plate 113 of structure 100 (i.e., the length 172 times the width (not shown) of the capacitor plate 113) is at least equal in size relative to an area measurement of the first device 120 (i.e., the length 173 times the width (not shown) of the device 120). The greater the area measurement of the first capacitor plate 113, the greater the capacitance of the capacitor 150. Referring to FIGS. 1-3 (structures 100a-c, respectively), the area measurement of the capacitor plate 113 is approximately equal in size to an area measurement of the first device 120 because the first deep trench isolation structure 131 that defines the first capacitor plate 113 is positioned immediately around the perimeter of the first device 120. Referring to FIG. 4 (structure 100d), the first deep trench isolation structure 131 may also be positioned around, but not immediately adjacent to the first device 120, thereby creating a first capacitor plate 113 that is larger than the first device 120. Alternatively, referring to the structure 100e illustrated in FIGS. 5-6, the structure may optionally comprise one or more second devices 122 in the active layer 101 and a plurality of devices 136, including the first device 120 and one or more third devices 123 separated by shallow trench isolation structures 135, also in the active layer 101. The first deep trench isolation structure 131 may also be positioned around the plurality of devices 136 in order to isolate the plurality of devices 136 from the second devices 122. Thus, the area measurement of the first capacitor plate 113 of structure 100e of FIGS. 5-6 may be significantly larger than an area measurement for the first device 120. A capacitor 150 having a larger first capacitor plate 113 extending under a plurality of devices 136 has a greater capacitance and can thus increases the Qcrit for the first circuit node 121 on a critical device 120 to a greater degree than a capacitor 150 with a smaller first capacitor plate 113 (e.g., as illustrated in FIGS. 1-4). Similarly, as the thickness 171 of the second insulator layer 104 and, thus, the capacitor dielectric 114 decreases, the capacitance of the capacitor 150 increases. The thickness 171 of the capacitor dielectric 114 can be set or tuned to give more or less capacitance per square area. As the thickness 171 decreases, the area of the first capacitor plate 113 can be decreased to maintain a given capacitance. Thus, there is a tradeoff between the thickness 171 of the capacitor dielectric 114 and the area of the first capacitor plate 113 to achieve a given capacitance and hence SER protection. Generally, the thickness 171 would be set globally whereas the area of the first capacitor plate 113 for each capacitor 150 would be set locally to achieve the desired capacitance for each critical device. For example, referring to FIGS. 1 and 3, the area measurements of the first capacitor plate 113 for structures 100*a* and 100*c* are approximately equal to the area measurements for the device 120. However, the thickness 171 of the capacitor dielectric 114 of FIG. 3 is greater than that of FIG. 1. Thus, the capacitance of the capacitor 150 of structure 100*c*, as illustrated in FIG. 3, would be less than the capacitance of the capacitor 150 of structure 100*a*, as illustrated in FIG. 1.

The first capacitor contact 141 contacts the first capacitor plate 113 and abuts the first circuit node 121 so that it effectively couples the first circuit node 121 to the first capacitor plate 113. The capacitor dielectric 114 comprises a portion of the second insulator layer 104 that is adjacent the first capacitor plate 113. Since the structure 100*b*, as illustrated in FIG. 2, comprises a patterned second insulator layer 104, the entire second insulator layer 104 and the entire first bulk layer 103 may comprise the capacitor dielectric 114 and first capacitor plate 113.

Referring to FIGS. 1-5, as discussed above, the entire second bulk layer 105 can comprise the silicon substrate and function as the second capacitor plate. Thus, the substrate contact can function as the second capacitor contact 142. Alternatively, referring to FIGS. 7-8, the semiconductor structure 100 can comprise additional layers (e.g., a third insulator layer 106 and a third bulk layer (i.e., separate silicon substrate 107)) and can be configured such that an isolated portion of the second bulk layer 105 can comprise the second capacitor plate 115. Note that the exemplary structures 100*f-g* illustrated in FIG. 7-8 combine these additional features with the structures 100*d* and 100*a*, respectively, of FIG. 4 and 1. However, these features (i.e., the additional layers and separate second capacitor plate 115) may also be combined with the structures 100*b-c* and 100*e*, illustrated in FIGS. 2-3 and FIG. 5, respectively. The second capacitor plate (105 of FIGS. 1-5 and 115 of FIG. 7-8) is insulated from the first capacitor plate 113 by the first deep trench isolation structure 131 and the capacitor dielectric 114. A second capacitor contact 142 contacts the second capacitor plate 105, 115. Referring to FIGS. 1-5, if the entire second bulk layer 105 comprises the second capacitor plate, then the second bulk layer 105 may be grounded. Referring to FIGS. 7-8, if only an isolated portion of the second bulk layer 105 comprises the second capacitor plate 115, then a second insulator-filled deep trench isolation structure 132 is formed around the second capacitor contact 142 (see FIG. 7) or optionally around the second capacitor contact 142 and one or more second devices 122 (see FIG. 8). The second deep trench isolation structure 132 extends to the second insulator layer 104. The second capacitor contact 142 may contact a wire array 160 above the active layer 101 (see FIG. 7) or may abut a second circuit node 124 of a second device 122 enclosed within the second deep trench isolation structure 132, thereby coupling the second capacitor plate 115 to the second device 122. Portions of the second deep trench isolation structure 132 and the first deep trench isolation structure 131 may be shared, so that the minimum number of deep trench isolation structures 131, 132 need be formed. Also, referring to FIGS. 7-8, if only an isolated portion of the second bulk layer 105 comprises the second capacitor plate 115, then the semiconductor structures 100*f-g* comprise a third insulator-filled deep trench isolation structure 133. The third deep trench isolation structure 133 is formed around the first deep trench isolation structure 131 and the second deep trench isolation structure 132, extends to the third insulator layer 106 and defines the portion of the second bulk layer 105 comprising the second capacitor plate 115. Portions of the first deep trench isolation structure 131, the second deep trench isolation structure 132 and the third deep trench isolation structure 133 may be shared, so that the minimum number of deep trench isolation structures 131, 132, 133 need be formed. Additionally, the semiconductor structures 100*f-g* may further comprise a substrate contact 143 contacting the substrate 107. The third deep trench isolation structure 133 and the third insulator layer 106 insulate the capacitor 150 from substrate 107.

In operation, multiple capacitors 150 incorporated into the structure 100 may be used to harden multiple devices 120 (e.g., multiple bi-stable devices of a flip-flop). Specifically, if a flip-flop comprises two components 120 (e.g., a master latch and a slave latch) and each component has two sensitive circuit nodes for a total of four sensitive circuit nodes 121, then four capacitors 150 could be incorporated into the structure 100 below the first insulator layer 102 such that each capacitor 150 is coupled to a specific circuit node 121. The capacitance between the first capacitor plate 113 and second capacitor plate (105 of FIGS. 1-5 and 115 of FIG. 7) increases the Qcrit of each first circuit node 121 proportionally. For example, if a flip-flop with an estimated size of approximately 16 micrometers squared ($um^2$), not including the area for the contacts, has two components each with two circuit nodes 121, then, divided evenly, there are 4 $um^2$/node. For a 20 nm dielectric the capacitance is approximately 1.75 femtofarads per micrometer squared ($fF/um^2$), so the capacitance for each node is approximately 7 fF. At 1.0 volt, the Qcrit for each node 121 increases roughly 7.0 fC, which would greatly reduce the soft error rate of the flip-flop.

Figure 10:
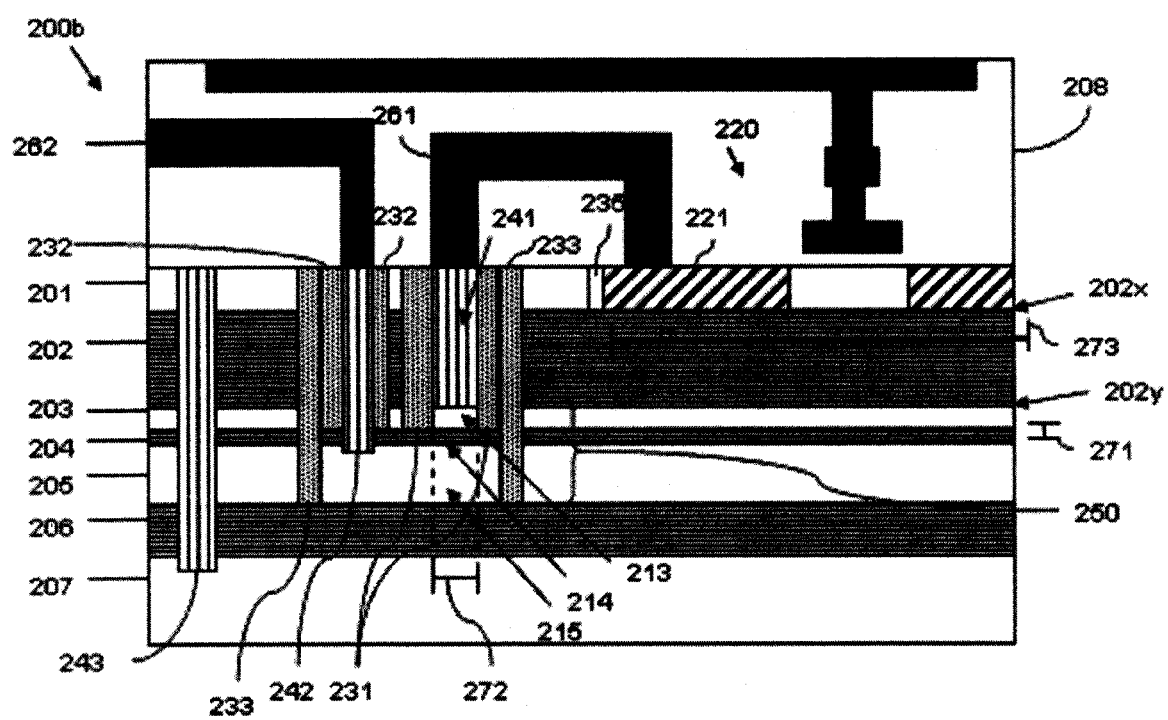
FIG. 10 is a schematic illustration of an embodiment of a semiconductor structure according to the invention.
Figure 11:
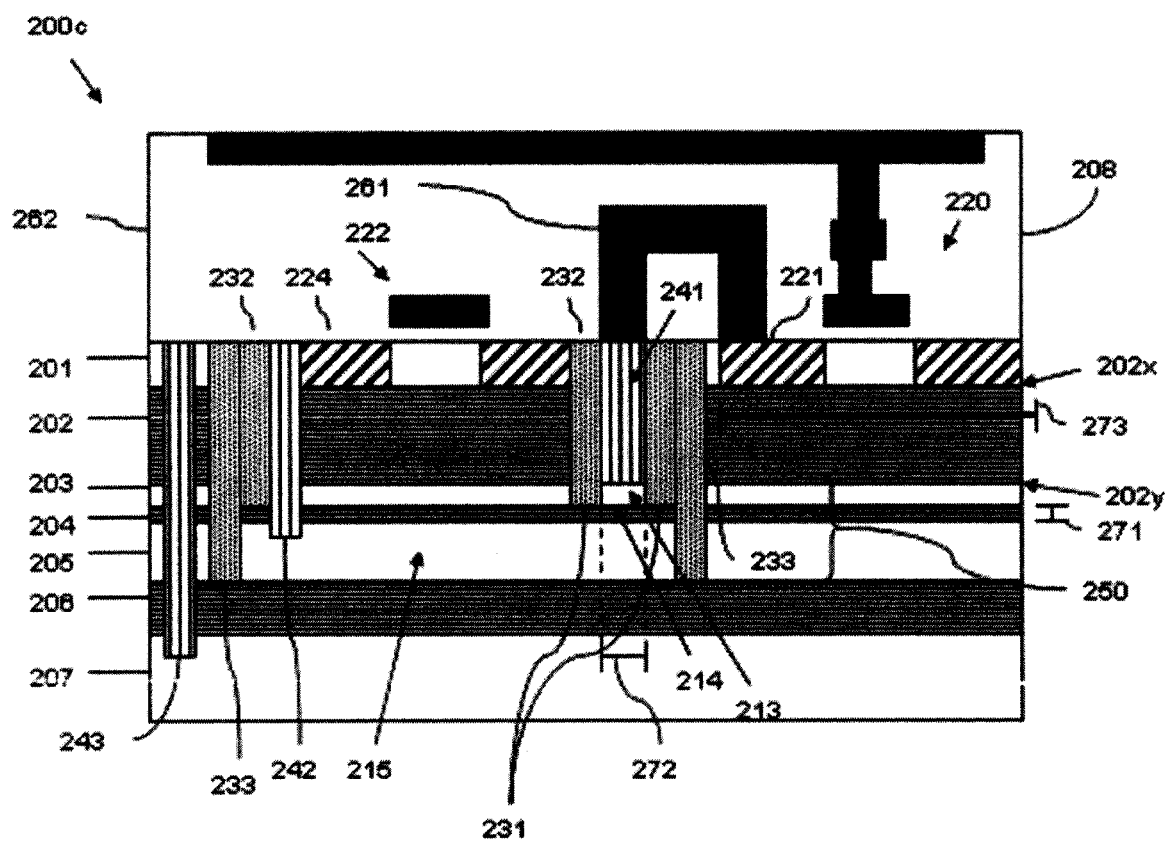
FIG. 11 is a schematic illustration of an embodiment of a semiconductor structure according to the invention.

Referring to FIGS. 9-11, a multi-layer semiconductor structure 200 incorporating a capacitor 250 to reduce the soft error rate of a first device 220 (e.g., a first device having a first circuit node 221) within the structure 200 is illustrated. The multi-layer semiconductor structure 200 comprises the following layers in order: an active layer 201, a first insulator layer 202, a first bulk layer 203, a second insulator layer 204 and a second bulk layer 205. The second insulator layer 204 may be continuous, as illustrated in FIGS. 9-11, or patterned. A capacitor 250 is coupled to the first device 220. The capacitor 250 comprises a first capacitor plate 213, a capacitor dielectric 214, a second capacitor plate (205 of FIG. 9 and 215 of FIGS. 10-11), a first conductive capacitor contact 241 and a second conductive capacitor contact 242. The configuration of the structure 200, as illustrated in FIGS. 9-11, differs from the earlier described structure 100. Specifically, structure 200 comprises a relatively small first capacitor plate 213 and a first wire array 261 above the active layer 201 connecting the first capacitor contact 241 to the first circuit node 221, whereas the structure 100 comprises a relatively large first capacitor plate 113 and a first capacitor contact 141 directly abutting the sensitive circuit node 121. The structure 200 incurs less performance penalty as compared to structure 100 because structure 200 may not provide as much capacitance as structure 100 and therefore, may not be as effective at increasing Qcrit of the sensitive node 221.

More particularly, referring to the semiconductor structures 200*a-c* of FIGS. 9-11, respectively, the first insulator layer 202 comprises a first side 202x and a second side 202y. The active layer 201 containing the first device 220 is positioned on the first side of the insulator layer 202x. The first capacitor plate 213 is positioned adjacent the second side of the first insulator layer 202y in a region offset from the position of the device 220 on the first side of the first insulator layer 202x. A first insulator-filled deep trench isolation structure 231 is positioned around the first capacitor contact 241 and extends to the second insulator layer 204. This first deep trench isolation structure 231 isolates the first capacitor contact 241 and defines a portion of the first bulk layer 203 comprising the first capacitor plate 213. As stated above, the capacitance of the capacitor 250 increases or decreases as a function of an area measurement of the first capacitor plate 213 (i.e., the length 272 times the width (not shown) of the first capacitor plate 213). The structure 200a-c would be applicable only when a minimal amount of capacitance is required to increase the Qcrit of the circuit node 221 because the first capacitor plate 213 of capacitor 250 is relatively small in order to limit the overall size of the structure 200a-c. Specifically, an area measurement of the first capacitor plate 213 (i.e., the length 272 times the width (not shown) of the first capacitor plate 213) is smaller in size relative to an area measurement of the first device 220 (i.e., length 273 times width (not shown) of the first device 220). The capacitor dielectric 214 comprises a portion of the second insulator layer 204 adjacent the first capacitor plate 213. The thickness 271 of the second insulator layer 204, and thereby the capacitor dielectric 214, may be varied to increase or decrease the capacitance of the capacitor 250 as needed. The isolated first capacitor contact 241 contacts the first capacitor plate 213 and a first wire array 261 above the active layer 201. The first wire array 261 can couple the first capacitor contact 241 and thereby, the first capacitor plate 213, to the first circuit node 221. The capacitor 250 can be configured to increase the minimum charge required to cause a soft error in the first circuit node 221.

Referring to the semiconductor structure 200a of FIG. 9, as discussed above, the entire second bulk layer 205 of structure 200a can comprise the silicon substrate, can be grounded and can function as the second capacitor plate. The substrate contact can function as the second capacitor contact 242. Alternatively, referring to the semiconductor structures 200b-c of FIG. 10-11, the semiconductor structure 200 may also comprise additional layers including a third insulator layer 206 and a third bulk layer (i.e., a separate silicon substrate 207) and be configured such that an isolated portion of the second bulk layer 205 comprises the second capacitor plate 215. The second capacitor plate (205 of FIG. 9 and 215 of FIG. 10-11) is insulated from the first capacitor plate 213 by the first deep trench isolation structure 231 and the capacitor dielectric 214. A second capacitor contact 242 contacts the second capacitor plate 205, 215.

Referring to the semiconductor structure 200b-c of FIGS. 10-11, if only an isolated portion of the second bulk layer 205 comprises the second capacitor plate 215, then a second insulator-filled deep trench isolation structure 232 is formed around the second capacitor contact 242 (see FIG. 10) and, optionally, around one or more second devices 222 (see FIG. 11). The second deep trench isolation structure 232 of FIGS. 10-11 extends to the second insulator layer 204. The second capacitor contact 242 may contact a second wire array 262 above the active layer 201 (see FIG. 10). Alternatively, the second capacitor contact 242 may abut a second circuit node 224 of a second device 222 enclosed within the second deep trench isolation structure 232, thereby, coupling the second capacitor plate 215 with the second device 222. Portions of the second deep trench isolation structure 232 and the first deep trench isolation structure 231 may be shared, so that the minimum number of deep trench isolation structures 231, 232 need be formed. The semiconductor structures 200b-c also comprise a third insulator-filled deep trench isolation structure 233. The third isolation structure 233 is formed around the first deep trench isolation structure 231 and the second deep trench isolation structure 232, extends to the third insulator layer 206 and defines the portion of the second bulk layer 205 comprising the second capacitor plate 215. Portions of the first deep trench isolation structure 231, the second deep trench isolation structure 232 and the third deep trench isolation structure 233 can be shared, so that the minimum number of deep trench isolation structures 231, 232, 233 need be formed. The semiconductor structures 200b-c may further comprise a substrate contact 243 contacting the substrate 207. The third deep trench isolation structure 233 and the third insulator layer 206 insulate the capacitor 250 from substrate 207.

The semiconductor structures 100, 200, as illustrated in FIGS. 1-11, of the present invention may be fabricated by various known techniques such as by a Unibond "Smart Cut"™ method, a bond and etch-back silicon-on-insulator (BESOI) method, or a separation by implantation of oxygen (SIMOX) method. These methods are described in U.S. Pat. No. 5,882,987 to Srikrishhnan issued on Mar. 3, 1999 and U.S. Pat. No. 6,365,488 to Liao issued on Apr. 2, 2002, both of which are incorporated herein by reference. Both the Smart Cut™ method and the BESOI methods form the structures by bonding two silicon-on-insulator (SOI) wafers together. Deep trenches for the various deep trench isolation structures (e.g., 131, 231; 132, 232; and, 133, 233) may be etched either before or after the two SOI wafers are bonded. After two SOI wafers are cleaned and bonded together, then the hydrogen-implanted wafer is cut away at the hydrogen-implanted region. The oxide grown on the oxidized wafer becomes the first insulator layer 102, 202 and the thin silicon layer above the hydrogen implant on the other wafer becomes the active layer 101, 201. The second insulator layers 104, 204 can be implanted in the first wafer before or after it is oxidized. Alternatively, the second insulator layer 104, 204 can be implanted through the first insulator layer 102, 202 for any silicon-on-insulator wafer fabrication method. Another method to make a thin second insulator layer 104, 204 across the entire semiconductor structure 100, 200 is to tailor the implants that form the first insulator layer 102, 202 using a separation by implantation of oxygen (SIMOX) method such that the oxygen implants are tailored to leave a thin silicon layer 103, 203, which can be appropriately p-doped or n-doped, between two insulator layers (i.e., oxide layers), one thick 102, 202 and one thin 104, 204. The ratio of oxide thicknesses is such that the capacitive coupling to the second capacitor plate (105 of FIGS. 1-5, 115 of FIGS. 7-8, 205 of FIG. 9, and 215 of FIGS. 10-11) is much greater than the capacitive coupling to the active silicon layer 101, 201.

Thus, as discussed above, the multi-layer semiconductor structure of the present invention comprises a capacitor incorporated into the semiconductor structure to increase Qcrit of a sensitive circuit node of a device in an active layer of the structure. The structure comprises an insulator-filled deep trench isolation structure that is formed through the active silicon layer, through a first insulator layer, through a first bulk layer and ends adjacent to a second insulator layer. The resulting isolated portion of the first bulk layer defines the first capacitor plate. A portion of the second insulator layer that is adjacent the first capacitor plate functions as the capacitor dielectric. The position and the size of the first capacitor plate relative to the position and size of the device varies depending upon the embodiment. Either the silicon substrate or a portion of a second bulk layer that is isolated by another insulator-filled deep trench isolation structure and a third insulator layer can comprise the second capacitor plate. A first capacitor contact couples, either directly or via a wire array, the circuit node of the device to the first capacitor plate. The resulting semiconductor structure can reduce the soft error rate of critical devices, by increasing Qcrit of the device's circuit nodes, with minimal performance and/or size penalties. While the invention has been described in terms of embodiments, those skilled in the art will recognize that the invention can be practiced with modification within the spirit and scope of the appended claims.

What is claimed is:

1. A semiconductor structure comprising:
   an active layer;
   a device in said active layer;
   a first insulator layer, having a first side and a second side, said first side of said first insulator layer being adjacent said active layer;
   a bulk layer adjacent said second side of said first insulator layer;
   a second insulator layer adjacent said first bulk layer;
   a deep trench isolation structure that is positioned adjacent said device and extends to said second insulator layer; and
   a capacitor coupled to said device, said capacitor comprising:
      a capacitor plate comprising a portion of said bulk layer, wherein said capacitor plate is defined by said deep trench isolation structure and is positioned adjacent said second side of said first insulator layer in a region opposite said device;
      a capacitor dielectric comprising a portion of said second insulator layer adjacent said first capacitor plate; and
      a capacitor contact contacting said capacitor plate.

2. The semiconductor structure of claim 1, wherein an area measurement of said capacitor plate is at least equal in size relative to an area measurement of said device.

3. The semiconductor structure of claim 1,
   wherein said device comprises a circuit node,
   wherein said capacitor contact couples said circuit node to said capacitor plate, and
   wherein said capacitor is configured to increase the minimum charge required to cause a soft error in said circuit node.

4. The semiconductor structure of claim 1, further comprising:
   a second device in said active layer; and,
   a plurality of devices in said active layer;
   wherein said deep trench isolation structure is positioned adjacent said plurality of devices and isolates said plurality of devices from said second device.

5. The semiconductor structure of claim 1, further comprising:
   a second bulk layer adjacent said second insulator layer, said second bulk layer comprising a second capacitor plate; and
   a second capacitor contact contacting said second capacitor plate;
   wherein said deep trench isolation structure and said capacitor dielectric insulate said capacitor plate from said second capacitor plate.

6. The semiconductor structure of claim 5, further comprising:
   a second deep trench isolation structure that is positioned adjacent said second capacitor contact;
   wherein said second deep trench isolation structure extends to said second insulator layer, and
   wherein said second capacitor contact further contacts a wire array above said active layer.

7. The semiconductor structure of claim 5, further comprising:
   a second device in said active layer, said second device comprising a second circuit node;
   a second deep trench isolation structure that encloses said second capacitor contact and said second device,
   wherein said second deep trench isolation structure extends to said second insulator layer, and
   wherein said second capacitor contact abuts said second circuit node, thereby, coupling said capacitor to said second device.

8. The semiconductor structure of claim 6, further comprising:
   a third insulator layer adjacent said second bulk layer; and
   a third deep trench isolation structure that encloses said deep trench isolation structure and said second deep trench isolation structure and extends to said third insulator layer,
   wherein said third deep trench isolation structure defines a portion of said second bulk layer that comprises said second capacitor plate.

9. The semiconductor structure of claim 7, further comprising:
   a third insulator layer adjacent said second bulk layer; and
   a htird deep trench isolation structure that encloses said first deep trench isolation stucture and said second deep trench isolation structure and extends to said third insulator layer, wherein said third deep trench isolation structure defines a portion of said second bulk layer that comprises said second capacitor plate.

10. A semiconductor structure comprising:
    an active layer;
    a device in said active layer, said device comprising a circuit node;
    a first insulator layer adjacent said active layer;
    a first bulk layer adjacent said first insulator layer;
    a second insulator layer adjacent said first bulk layer;
    a first deep trench isolation structure that extends to said second insulator layer;
    a second deep trench isolation structure that extends to said second insulator layer;
    a second bulk layer adjacent said second insulator layer;
    a third insulator layer adjacent said second bulk layer;
    a third deep trench isolation structure that encloses said first deep trench isolation structure and said second deep trench isolation structure and extends to said third insulator layer;
    a capacitor coupled to said device, said capacitor comprising:
       a first capacitor plate comprising a portion of said first bulk layer that is isolated by said first deep trench isolation structure;
       a capacitor dielectric comprising a portion of said second insulator layer adjacent said first capacitor plate;

a second capacitor plate comprising a portion of said second bulk layer that is defined by said third deep trench isolation structure;

a first capacitor contact contacting said first capacitor plate; and, a second capacitor contact that is isolated by said second deep trench isolation structure and contacts said second capacitor plate.

11. The semiconductor device of claim 10, further comprising:

a wire array above said active layer contacting said first capacitor contact and said circuit node;

wherein said first capacitor plate is positioned adjacent said first insulator layer in a region offset from said device, and wherein an area measurement of said first capacitor plate is smaller in size relative to an area measurement of said device.

12. The semiconductor device of claim 10, wherein said first capacitor contact abuts said circuit node, wherein said first capacitor plate is positioned adjacent said first insulator layer in a region opposite said device, and wherein an area measurement of said first capacitor plate is at least equal in size relative to an area measurement of said device.

* * * * *